United States Patent
Myoung et al.

(10) Patent No.: US 9,537,520 B2
(45) Date of Patent: Jan. 3, 2017

(54) METHOD AND APPARATUS FOR CALIBRATING DISTORTION OF SIGNALS

(71) Applicant: Samsung Electronics Co., Ltd., Gyeonggi-do (KR)

(72) Inventors: Seong-Sik Myoung, Gyeonggi-do (KR); Young-Hwan Choo, Seoul (KR); Seung-Chan Heo, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/712,526

(22) Filed: May 14, 2015

(65) Prior Publication Data

US 2015/0333850 A1 Nov. 19, 2015

Related U.S. Application Data

(60) Provisional application No. 61/996,846, filed on May 14, 2014.

(30) Foreign Application Priority Data

Jul. 23, 2014 (KR) ........................ 10-2014-0093184

(51) Int. Cl.
*H04B 1/40* (2015.01)
*H04B 1/04* (2006.01)
*H04B 17/11* (2015.01)
*H04B 17/14* (2015.01)

(52) U.S. Cl.
CPC ............. *H04B 1/0475* (2013.01); *H04B 17/11* (2015.01); *H04B 17/14* (2015.01); *H04B 2001/0425* (2013.01)

(58) Field of Classification Search
CPC ..... H04B 17/14; H04B 17/0085; H04B 17/21; H04B 17/29; H04B 7/005; H04B 17/11; H04B 1/0475; H04B 2001/0425

USPC .......................................................... 455/84
See application file for complete search history.

(56) References Cited

U.S. PATENT DOCUMENTS

| | | | |
|---|---|---|---|
| 5,579,005 A | 11/1996 | Moroni | |
| 6,963,603 B1* | 11/2005 | Rezvani | H04B 3/56 370/206 |
| 2004/0132424 A1* | 7/2004 | Aytur | H04B 1/0475 455/335 |
| 2006/0009171 A1 | 1/2006 | Xu et al. | |
| 2008/0013639 A1 | 1/2008 | Rick et al. | |
| 2009/0088120 A1 | 4/2009 | Ling et al. | |

(Continued)

FOREIGN PATENT DOCUMENTS

KR 10-2008-0095004 10/2008
KR 10-2009-0059958 6/2009

OTHER PUBLICATIONS

Homg-Yuan Shih et al., A Highly-Integrated 3-8 GHz Ultra-Wideband RF Transmitter With Digital-Assisted Carrier Leakage Calibration and Automatic Transmit Power Control.

(Continued)

*Primary Examiner* — Ajibola Akinyemi
(74) *Attorney, Agent, or Firm* — The Farrell Law Firm, P.C.

(57) ABSTRACT

An electronic device for and method of determining a calibration code is provided. The electronic device includes a modem configured to receive a transmission signal, determine a calibration code that minimizes distortion of the transmission signal, and calibrate the distortion of the transmission signal using the calibration code.

16 Claims, 13 Drawing Sheets

(56) References Cited

U.S. PATENT DOCUMENTS

| | | |
|---|---|---|
| 2009/0161778 A1 | 6/2009 | Okada et al. |
| 2009/0213951 A1 | 8/2009 | Okada et al. |
| 2009/0227214 A1 | 9/2009 | Georgantas et al. |
| 2010/0099363 A1 | 4/2010 | Faust et al. |
| 2010/0120369 A1 | 5/2010 | Ko et al. |
| 2010/0232530 A1 | 9/2010 | Ebisawa et al. |

OTHER PUBLICATIONS

IEEE Transactions on Very Large Scale Integration (VLSI) Systems, vol. 20, No. 8, Aug. 2012.

\* cited by examiner

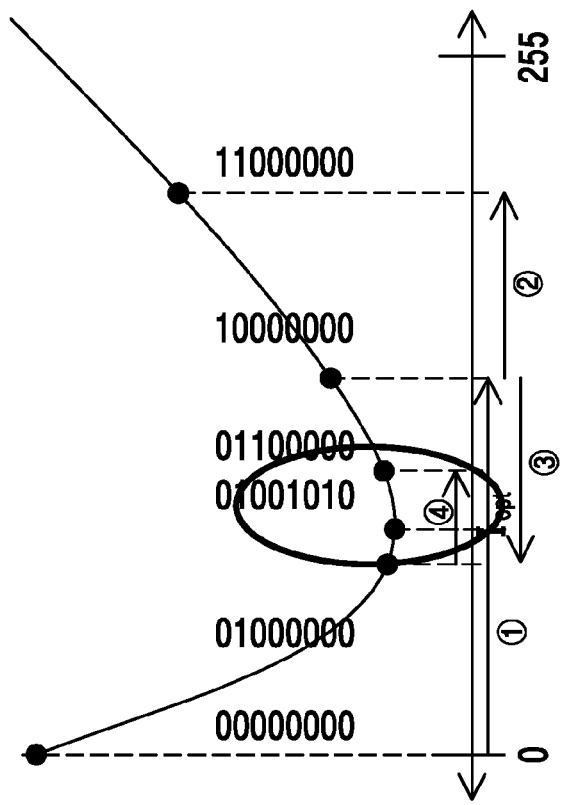
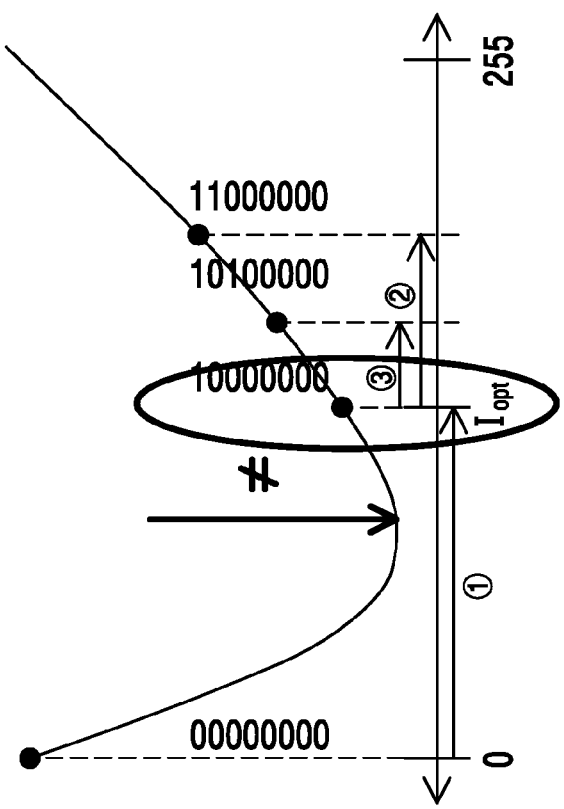
FIG.12B
FIG.12A

100

METHOD AND APPARATUS FOR CALIBRATING DISTORTION OF SIGNALS

PRIORITY

This application claims priority under 35 U.S.C. §119(a) and §120 to a U.S. Provisional Patent Application Serial filed on May 14, 2014 in the United States Patent and Trademark Office and assigned Ser. No. 61/996,846 and a Korean Patent Application filed on Jul. 23, 2014 in the Korean Intellectual Property Office and assigned Serial No. 10-2014-0093184, the entire contents of which are incorporated herein by reference.

BACKGROUND

1. Field of the Disclosure

The present disclosure relates generally to a transceiver of an electronic device, and more particularly, to a calibration apparatus and method for minimizing distortion of a signal of a wireless transceiver.

2. Description of the Related Art

Technologies that use a frequency mixer to convert a baseband signal or an intermediate frequency signal into a Radio Frequency (RF) signal, or to convert an RF signal into a baseband signal or an intermediate frequency signal, have been widely utilized in the wireless communication field.

However, a Local Oscillator (LO) leakage signal (or carrier leakage) may act as an interference signal in the frequency mixer, and thus, the required wireless communication standard may not be satisfied or the modulation accuracy of a communication signal may deteriorate. The carrier leakage may occur when an LO signal leaks due to a parasitic capacitance component of the frequency mixer or may occur when a frequency component of a Direct Current (DC) component existing in a baseband circuit flows into the LO signal. The leakage of the LO signal may be calibrated by applying a DC offset signal that corresponds to an inverse of the LO leakage signal to an input of the frequency mixer. The DC offset may be embodied in a Digital-to-Analog Convertor (DAC) having a resolution of a predetermined bit length, and an algorithm for determining a DAC control code for obtaining an optimal (that is, minimized) carrier leakage, is needed. For example, when the resolution of a DAC for calibration is N bits, as many as $2^N$ events may occur. The frequency mixer of a transceiver is formed of an I-path and a Q-path, and an I-DAC and a Q-DAC exist as a DAC for calibration and thus, the number of events for selecting an optimal control code may be $2^{2N}$ ($=2^N \times 2^N$).

In addition, I/Q mismatch may occur in the frequency mixer. The I/Q mismatch refers to a mismatch of a size (or gain) and a phase between transfer characteristics of the I-path and the Q-path of the front end including the frequency mixer of the transceiver, and the I/Q mismatch may generate an image signal of a modulation signal and may deteriorate the quality of a transmission signal.

To calibrate the I/Q mismatch, a calibration circuit corresponding to an inverse of the frequency mixer, which may be modeled using a size (g) and a phase ($\Phi$), may be used. The calibration of the size and the phase may be executed based on a method of searching for a calibration code having a determined bit length from a digital domain. This may be executed in the same manner as the method of searching for an optimal control code for calibration of carrier leakage.

In addition, in a wireless receiver, a high frequency interference signal may act as noise in a baseband by a $2^{nd}$ order non-linear component (or $2^{nd}$ harmonic signal or $2^{nd}$ order intermodulation distortion (hereinafter referred to as a $2^{nd}$ order intercept-point (IP2))) generated from a frequency down-conversion mixer for converting an RF signal into a baseband signal. To calibrate the above, an IP2 calibration procedure is needed. The IP2 calibration may also be executed through a process of searching for an optimal control code that minimizes an IP2 component of an I/Q frequency mixer. For example, the receiver requires a function of calibrating the I/Q mismatch and IP2.

A function associated with an amount of carrier leakage based on a control code (I-code and Q-code), that is, an I-DAC and a Q-DAC, for calibration of carrier leakage, generally has two characteristics. First, the size of carrier leakage may show a monotonic increment or monotonic decrement as an I-code value or a Q-code value increases, and is provided in a form of a convex quadratic parabola. Second, an amount of carrier leakage is observed by changing an I-code by one for each time, so as to detect an I-code ($I_{min}$) that minimizes carrier leakage. In this instance, $I_{min}$ may be changed based on a Q-code. The characteristic may be identical in the case of a Q-code that minimizes carrier leakage. That is, $I_{min|Q=Q1} \ne I_{min|Q=Q2}$ and $Q_{min|I=I1} \ne Q_{min|I=I2}$. Therefore, in the case of an I-DAC and a Q-DAC having N-bit resolution, when the search for a code is executed with respect to the number of combinations of all codes ($=2^N \times 2^N$) so as to detect a code combination ($I_{opt}$ and $Q_{opt}$) that minimizes carrier leakage from among all code combinations of the I-code and the Q-code in two-dimensions, the time expended to search for the code may be great. For example, when N=8, 65,536 ($=2^8 \times 2^8$) searches may be executed to detect $I_{opt}$ and $Q_{opt}$.

As a method of improving a code searching time, a method of determining a Q-code, detecting an $I_{min}$ code that minimizes carrier leakage by repeatedly changing an I-code, fixing an I-code based on the detected $I_{min}$, and detecting a $Q_{min}$ code that minimizes carrier leakage by repeatedly changing a Q-code, may be used. Due to the I/Q dependency problem in which an $I_{min}$ and an $Q_{min}$ are affected by a Q-code and an I-code, respectively, a method of fixing a Q-code as a $Q_{min}$ and repeatedly detecting an $I_{min}$ that minimizes carrier leakage by changing an I-code and repeats the process with respect to the Q-code, may be used. In this instance, at least four code search processes are required (I-code→Q-code→I-code→Q-code→ . . . ). When the number of repeated searches is $N_{repeat}$, a total of ($N_{repeat} \times 2^N$) searching time is required. For example, when N=8 and the search is repeated only 4 times which is a smallest number of repeats ($N_{repeat}$=4), ($4 \times 2^8$=1,024) searches may be required. However, the method still requires a large number of searches and there is a large probability of failing an optimal code Iopt and Qopt when I/Q code searching is insufficiently repeated.

As described above, a code searching time is long due to the characteristics of a function of a control code and I/Q dependency, when the search for an optimal I/Q code for calibration of carrier leakage, the search for an optimal I/Q code for calibration of I/Q mismatch, and the search for an optimal I/Q code for calibration of IP2 are executed.

SUMMARY

The present disclosure has been made to address the above-mentioned problems and disadvantages, and to provide at least the advantages described below. Accordingly, an aspect of the present disclosure provides a method and apparatus for effectively searching for a control code for calibration of distortion of a signal.

Another aspect of the present disclosure provides a method and apparatus for calibrating carrier leakage.

Another aspect of the present disclosure provides a method and apparatus for calibrating I/Q mismatch.

Another aspect of the present disclosure provides a method and apparatus for calibrating IP2.

Another aspect of the present disclosure provides a binary search algorithm for calibrating carrier leakage, I/Q mismatch, and IP2.

BRIEF DESCRIPTION OF THE DRAWINGS

The above and other aspects, features, and advantages of the present disclosure will be more apparent from the following detailed description, taken in conjunction with the accompanying drawings, in which:

FIGS. 12A and 12B each illustrate a binary search algorithm for searching for a calibration code according to an embodiment of the present disclosure.

DETAILED DESCRIPTION OF EMBODIMENTS OF THE PRESENT DISCLOSURE

Hereinafter, embodiments of the present disclosure are described in detail with reference to the accompanying drawings. Further, in the following description of the present disclosure, a detailed description of known functions and configurations incorporated herein are omitted when it may obfuscate the subject matter of the present disclosure. The terms described below are terms defined in consideration of the functions in the present disclosure, and may be different according to users, intentions of the users, or customs. Accordingly, the definitions of the terms should be made on the basis of the overall context of the present disclosure.

Various embodiments of the present disclosure are associated with calibration for suppressing an emission of a Local Oscillator (LO) signal component from a transmitter into the air (e.g. LO leakage suppression calibration or carrier suppression calibration), calibration for minimizing signal distortion caused by I/Q mismatch (e.g. I/Q mismatch calibration), and calibration for minimizing deterioration in performance caused by a $2^{nd}$ order harmonic signal or $2^{nd}$ order intermodulation distortion (hereinafter referred to as $2^{nd}$ order intercept-point (IP2)) of a receiver.

The calibration function may be included in a Radio-Frequency Integrated Circuit (RFIC) or a modem integrated circuit (IC), and may be executed before an electronic device using the RFIC or the modem IC is released or may be periodically executed while the electronic device is used by a user.

Hereinafter, various embodiments of the present disclosure describe a method and apparatus for calibrating the distortion of a transmitted or received signal.

Figure 1:
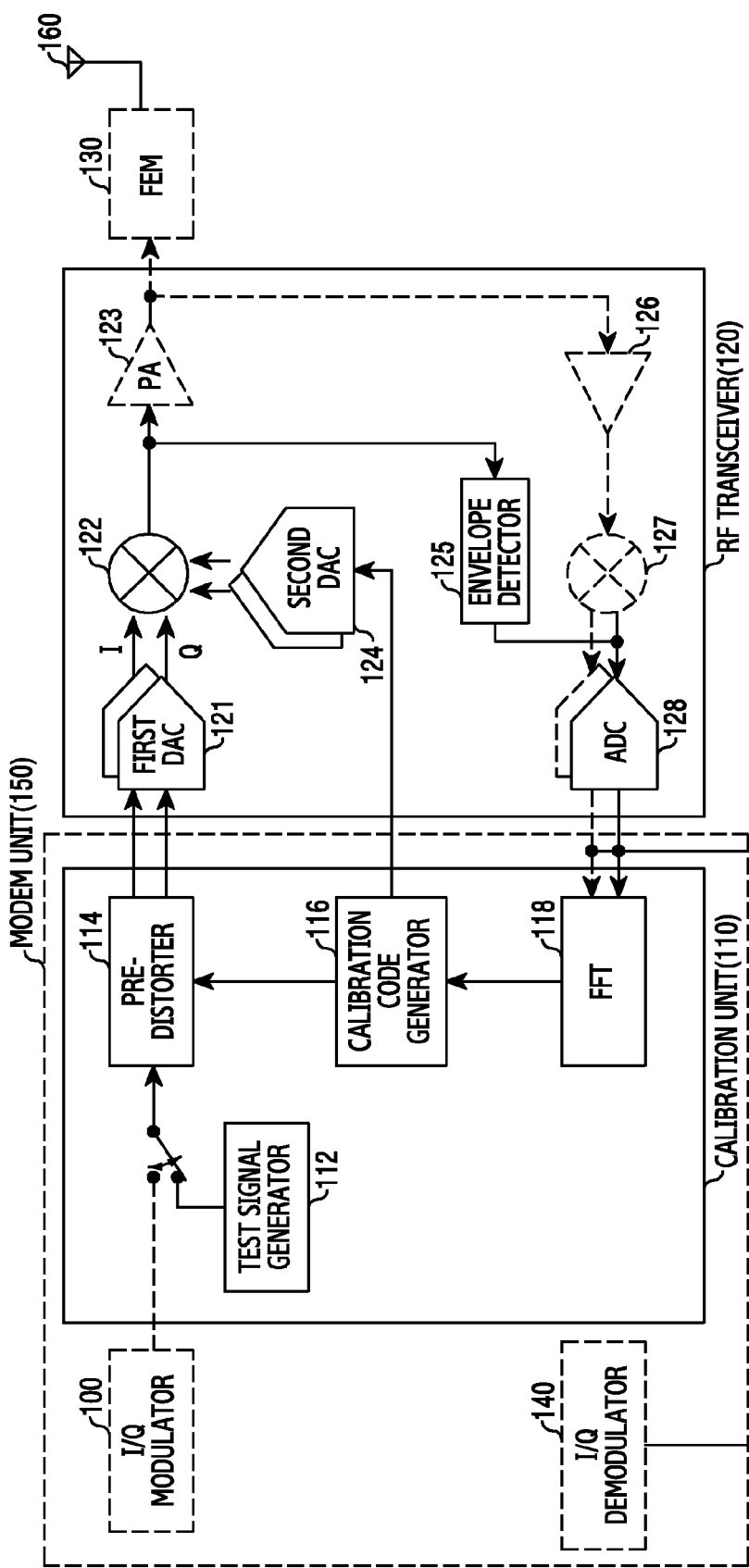
FIG. 1 is a block diagram of a transceiver according to an embodiment of the present disclosure.

FIG. 1 is a block diagram of a transceiver according to an embodiment of the present disclosure.

Referring to FIG. 1, the transceiver is formed of a modem unit 150, an RF transceiver 120, and a Front End Module (FEM) 130. The modem unit 150 includes an I/Q modulator 100, an I/Q demodulator 140, and a calibration unit 110. The calibration unit 110 includes a test signal generator 112, a pre-distorter 114, a calibration code generator 116, and a Fast-Fourier Transform (FFT) calculator 118. The RF transceiver 120 includes a first Digital-to-Analog Converter (DAC) 121, a first frequency mixer 122, a Power Amplifier (PA) 123, a second DAC 124, an envelope detector 125, a Low-Noise Amplifier (LNA) 126, a second frequency mixer 127, and an Analog-to-Digital Converter (ADC) 128.

According to an embodiment of the present disclosure, the calibration unit 110 of the modem unit 150 may be embodied in the RF transceiver 120, or may be embodied as a separate hardware block from the modem unit 150 and the RF transceiver 120.

According to an embodiment of the present disclosure, a few of the component elements of the modem unit 150 or the RF transceiver 120 may be embodied in software or a combination of software and hardware. For example, the calibration code generator 116 of the calibration unit 110 may be embodied as software or a combination of software and hardware.

According to an embodiment of the present disclosure, the calibration code generator 116 of the calibration unit 110 may be a separate external device, and may be connected to the transceiver through an interface (for example, a cable).

In the RF transceiver 120, the first DAC 121, the first frequency mixer 122, and the PA 123 form a transmit path (e.g. a Tx path). In the RF transceiver 120, the LNA 126, the second frequency mixer 127, and the ADC 128 form a reception path (e.g. an Rx path).

The modem unit 150 processes a baseband signal, and outputs the processed baseband signal to the RF transceiver 120. The RF transceiver 120 converts the baseband signal received from the modem unit 150 into an RF signal (or high frequency signal), and outputs the converted signal to the FEM 130. The FEM 130 separates a transmission signal and a reception signal, so as to emit a transmission signal through an antenna and to transfer a reception signal from the antenna 160 to the RF transceiver 120. The FEM 130 may include an Antenna Switch Module (ASM) that distinguishes a transmission signal and a reception signal, and a filtering unit that filters a reception signal. In this case, the filtering unit may include a Low Pass Filter (LPF), a Surface Acoustic Wave (SAW) filter, or the like.

In the modem unit 150, the I/Q modulator 100 modulates a bit sequence into a transmission signal formed of an I channel signal and a Q channel signal, based on a corresponding modulation scheme. The modulation scheme may include Quadrature Phase Shift Keying (QPSK), Offset Quadrature Phase Shift Keying (OQPSK), π/4-Differential Quadrature Phase Shift Keying (DQPSK), Walsh QPSK, Hybrid QPSK, M-ary Phase Shift Keying (MPSK), Amplitude Phase Shift Keying (APSK), Hierarchical PSK, or the like. Conversely, the I/Q demodulator 140 demodulates, into a bit sequence, a reception signal in an I/Q form that passes through a reception path, based on the corresponding modulation scheme.

The calibration unit 110 calibrates by generating a calibration value or a control code for minimizing distortion of a signal or deterioration in performance caused by at least one of I/Q mismatch and carrier leakage (or DC offset). In addition, the calibration unit 110 calibrates by generating a calibration value or a control code for minimizing deterioration in performance caused by a $2^{nd}$ order intercept-point (IP2) in a receiver.

The test signal generator 112 generates a sine wave having a phase difference of 90 degrees and outputs the same to the pre-distorter 114, so as to generate a calibration code. For example, $I(t)=At \cdot sin(\omega t)$ and $Q(t)=At \cdot cos(\omega t)$ signals may be generated.

The pre-distorter 114 is provided with a calibration code for calibrating distortion of a signal caused by carrier leakage and I/Q mismatch, from the calibration code generator 116, and applies the calibration code to the signal so as to change a DC offset or an amplitude and a phase of an I/Q signal. Based on the changed DC offset or the changed amplitude and phase of the I/Q signal, a digital signal from the I/Q modulator 100 or the test signal generator 112 may be calibrated.

In the process of executing carrier leakage calibration, I/Q mismatch calibration, or a calibration procedure to minimize deterioration in performance caused by IP2, the test signal generator 112 is connected to the pre-distorter 114 and outputs a test signal to the pre-distorter 114.

The calibration code generator 116 determines a calibration code using a spectrum of an output signal of the FFT calculator 118 and a binary search algorithm. The binary search algorithm according to an embodiment of the present disclosure is described in detail below with reference to FIGS. 8 to 11.

Figure 2:
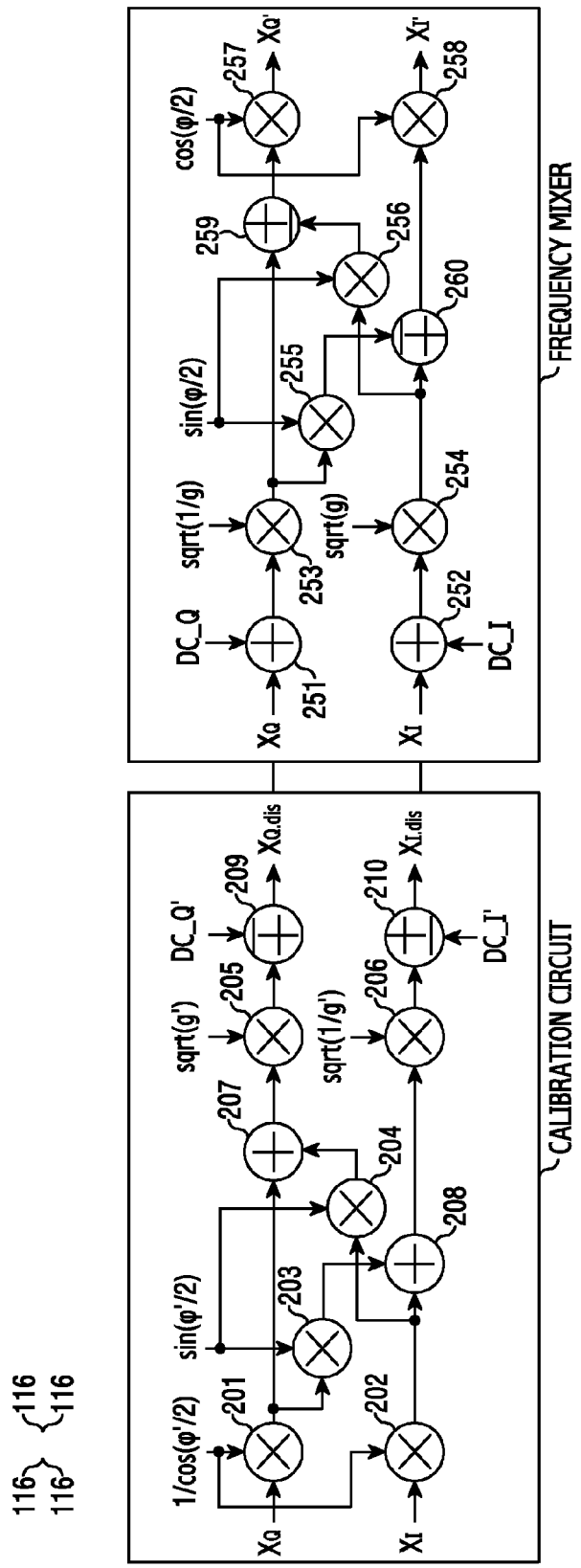
FIG. 2 is a block diagram of a frequency mixer according to an embodiment of the present disclosure.

The determined calibration code is applied to the pre-distorter 114, and calibrates a phase and a size of an input digital signal. According to an embodiment of the present disclosure, the determined calibration code is provided to the RF transceiver 120, and changes a DC offset, a phase or amplitude of a signal, through a calibration circuit in the frequency mixer 122 as illustrated in FIG. 2 and described below.

The FFT calculator 118 performs an FFT calculation on an output signal from the ADC 128. For example, the FFT calculator 118 converts a signal in the time domain into a signal in the frequency domain. As illustrated in FIGS. 9A-9D, a signal spectrum of each block output is output.

In the RF transceiver 120, the first DAC 121 converts a digital signal (e.g. I/Q signal) or a baseband signal from the pre-distorter 114, into an analog signal, and outputs the converted signal to the first frequency mixer 122.

According to an embodiment of the present disclosure, in the case of the frequency mixer 122, an input is formed of an I-path and a Q-path. The I-path and the Q-path may be formed of I-positive ($I_p$) and I-negative ($I_n$), and Q-positive ($Q_p$) and Q-negative ($Q_n$), respectively. Two DACs for calibrating carrier leakage are included in the first DAC 121, that is, an I-DAC for adjusting an offset of Ip and In and a Q-DAC for adjusting an offset of $Q_p$ and $Q_n$.

The first frequency mixer 122 up-converts an I/Q signal of a baseband (or an intermediate frequency) into a Radio Frequency (RF) signal (or a high frequency signal), and outputs the converted signal to the PA 123. In addition, an output signal of the first frequency mixer 122 is provided to the FFT calculator 118 via the envelope detector 125 and the ADC 128. According to an embodiment of the present disclosure, the first frequency mixer 122 calibrates a DC offset, a phase, and an amplitude based on an analog signal from the second DAC 124, and up-converts an I/Q signal into an RF signal.

The PA 123 may amplify an RF signal or a high frequency signal from the first frequency mixer 122 and output the amplified signal to the FEM 130. In addition, an output signal of the PA 123 may be fed back to a reception path, and may be provided to the FFT calculator 118.

According to an embodiment of the present disclosure, the PA 123 may be a power amplifier having a structure of EnvelopeTracking (ET), Envelope Elimination & Restoration (EER), or Hybrid ET. However, according to an embodiment of the present disclosure, it may not be limited to the structure of a power amplifier.

The second DAC 124 converts a calibration code from the calibration code generator 116 into an analog signal, and outputs the converted signal to the first frequency mixer 122 (or the second frequency mixer 127). The calibration code converted into an analog signal is used as a value for calibrating a DC offset, a phase, or a amplitude in a circuit (as illustrated in FIG. 2 and described below) for calibrating carrier leakage and I/Q mismatch.

The envelope detector 125 detects an envelope from an output signal of the first frequency mixer 122, and outputs the detected envelope to the ADC 128.

The LNA 126 is a high frequency amplifier that is configured to decrease a noise factor of the whole receiver, and amplifies a weak RF signal received through an antenna to a signal in a level appropriate for being processed in the second frequency mixer 127.

The second frequency mixer 127 down-converts a reception signal amplified in the LNA 126 into an I/Q signal of a baseband (or an intermediate frequency).

The ADC 128 converts an analog output signal of the second frequency mixer 127 and an analog output signal (for example, an envelope signal) of the envelope detector 125, into a digital signal, and outputs the digital signal to the FFT calculator 118.

As described above, to calibrate carrier leakage and I/Q mismatch, the test signal generator 112 generates a sine wave (or test tone), and the calibration code generator 116 generates a calibration signal using a shape of distortion caused by carrier leakage and I/Q mismatch in a transmit path. Two methods exist for analyzing the shape distorted by carrier leakage and I/Q mismatch. According to a first method, the PA 123 output in a transmit path conducts an analysis using a spectrum of an output signal from a high frequency band. According to a second method, an analysis is executed using a spectrum of an output signal from the frequency mixer 122. The envelope detector 125 detects an envelope signal from an output signal of the frequency mixer 122, the ADC 128 converts the envelope signal into a digital signal, and a spectrum of the converted signal is output through an FFT calculation of the FFT calculator 118. An embodiment of the present disclosure may be applied to each method. The calibration code generator 116 generates a code (hereinafter referred to as a calibration code) for calibrating carrier leakage and I/Q mismatch, using signal spectrum analysis.

According to an embodiment of the present disclosure, a calibration code for calibrating I/Q mismatch in a reception path (or a calibration code for calibrating deterioration in performance caused by IP2) may be determined using an RF signal received through an antenna.

FIG. 2 is a block diagram of a frequency mixer according to an embodiment of the present disclosure.

Referring to FIG. 2, the frequency mixer 122, 127 further includes a calibration circuit. The calibration circuit include multipliers 201, 202, 203, 204, 205, 206, adders 207, 208, and adder/subtracters 209, 210. The multipliers 201, 202, 203, 204 perform a multiplication to compensate a phase mismatch, and the multipliers 205, 206 perform a multiplication to compensate a gain mismatch. Adders 207, 208 perform addition to compensate phase mismatch. Adder/subtracter 209, 210 perform subtraction to compensate LO leakage.

The frequency mixer 122, 127 include adders 251, 252, multipliers 253, 254, 255, 256, 257, 258 and adder/subtracter 259, 260. Adders 251, 252 perform addition to model LO leakage. The multipliers 253, 254 perform a multiplication to model a gain mismatch, and the multipliers 255, 256, 257, 258 perform a multiplication to model a phase mismatch. Adder/subtracters 259, 260 perform subtraction to compensate LO leakage.

A frequency mixer combines a frequency component ($f_{test}$) of an input signal and a frequency component ($f_{LO}$) of an LO, and thus, an output frequency component of the frequency mixer may be $f_{test} \pm f_{LO}$. In a Q-path and an I-path, g denotes an amplitude (or a gain), Φ denotes a phase, and DC_Q and DC_I denotes a DC offset.

$$X_I = \cos(2\pi f_{test}), X_Q = \sin(2\pi f_{test}), X_I' = \cos(2\pi (f_{test} + f_{LO})),$$
$$\text{and } X_Q' = \sin(2\pi (f_{test} + f_{LO}))$$
Equation (1)

According to an embodiment of the present disclosure, a calibration circuit may be added to an input of the frequency mixer. The calibration circuit may correspond to an inverse function of the frequency mixer. For example, when g is applied to the frequency mixer, the calibration circuit may apply 1/g. When 1/g is applied to the frequency mixer, the calibration circuit may apply g. In the same manner, when a DC offset, that is, DC_Q and DC_I, is added to the frequency mixer, DC_Q and DC_I are subtracted in the calibration circuit. "g," "DC_I," AND "DC_Q" AND "φ" mean the real I/Q mismatch and LO leakage values of the frequency mixer. 1/g' (or g PRIME), DC_I' AND DC_Q' AND φ' mean the values for I/Q mismatch and LO leakage. For the ideal case, "g," "DC_I," AND "DC_Q" AND "φ" should be the same as 1/g' (or g PRIME), DC_I' AND DC_Q' AND φ', respectively, and I/Q mismatch and LO leakage have clearly disappeared.

A phase, an amplitude, and a DC offset in the calibration circuit may be adjusted by the calibration code generator 116 of FIG. 1.

Figure 3:
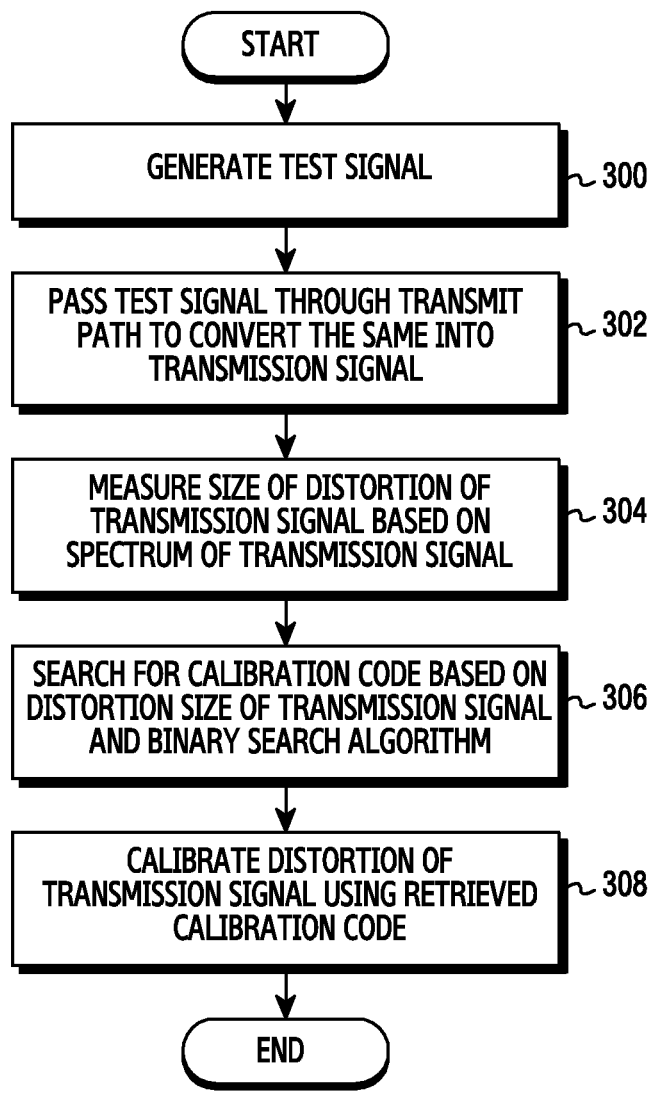
FIG. 3 is a flowchart of a method of calibrating distortion of a signal of a transceiver according to an embodiment of the present disclosure.

FIG. 3 is a flowchart of a method of calibrating distortion of a signal of a transceiver according to an embodiment of the present disclosure.

Referring to FIG. 3, the test signal generator 112 generates a test signal to calibrate deterioration in performance caused by at least one of carrier leakage, I/Q mismatch, and IP2, in step 300. For example, the test signal may be a sine wave having a phase difference of 90 degrees.

The RF transceiver 120 passes the test signal generated by the test signal generator 112 through a transmit path to convert the test signal into a transmission signal, in step 302. Conversion of a transmission signal is described below with reference to FIGS. 3 and 4. The transmission signal may be fed back and provided to the modem unit 150.

The FFT calculator 118 measures a size of distortion of a transmission signal based on a spectrum of the transmission signal, in step 304. For example, the FFT calculator 118 analyzes a characteristic of distortion of the transmission signal based on the spectrum of the transmission signal.

For example, $f_C - f_{test}$ shown in a spectrum is incurred by I/Q mismatch, and $f_C$ shown in a spectrum is incurred by carrier leakage. $f_C$ is a center frequency of a carrier wave, and $f_{test}$ is a center frequency of a test signal.

The calibration code generator 116 searches for or determines a calibration code, based on a characteristic of distortion of the transmission signal and a binary search algorithm, in step 306.

Figure 8:
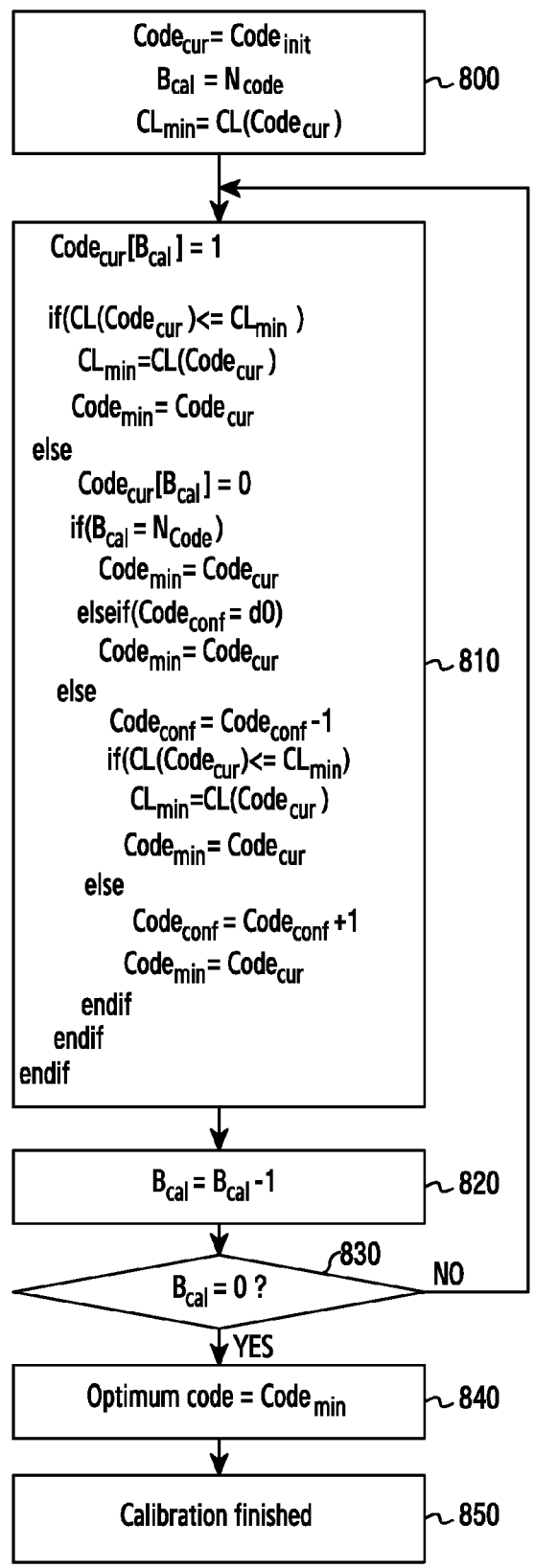
FIG. 8 is a flowchart of a binary search algorithm for searching for a calibration code according to an embodiment of the present disclosure.

For example, the calibration code generator 116 compares a distortion size of a transmission signal before and after increasing or decreasing a bit value by increasing or decreasing a bit value in an N-bit calibration code, by one each time, so as to change or maintain the corresponding bit value. After increasing or decreasing a bit value with respect to N bits, a value of a current N bits is a calibration code (as illustrated in FIG. 8 and described below).

In step 308, the pre-distorter 114 or the frequency mixer 122 may change a DC offset, or a phase or an amplitude of a signal, based on the calibration code determined in the calibration code generator 116, so as to calibrate the distortion of the transmission signal.

Figure 4:
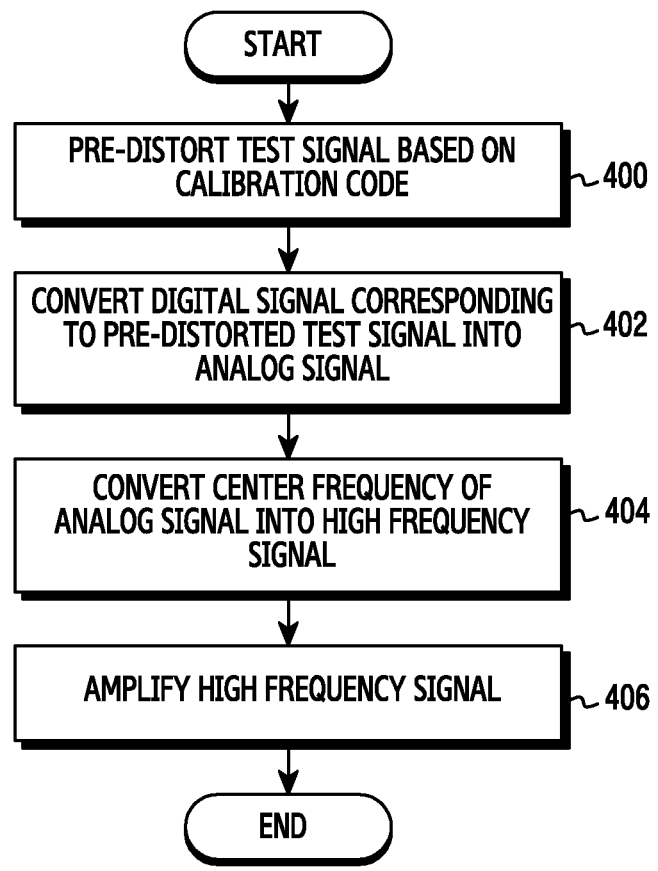
FIG. 4 is a flowchart of a method of processing a transmission signal according to an embodiment of the present disclosure.

FIG. 4 is a flowchart of a method of processing a transmission signal according to an embodiment of the present disclosure.

Referring to FIG. 4, the pre-distorter 114 changes a phase or amplitude of a test signal (or a baseband signal) or changes an DC offset and outputs the same, based on a calibration code provided by the calibration code generator 116, in step 400.

The first DAC 121 converts a calibrated digital signal into an analog signal in step 402.

The first frequency mixer 122 up-converts a center frequency of the analog output signal of the first DAC 121, so as to output an RF signal (e.g. high frequency signal), in step 404.

The PA 123 amplifies the RF signal (e.g. high frequency signal), in step 406.

Figure 5:
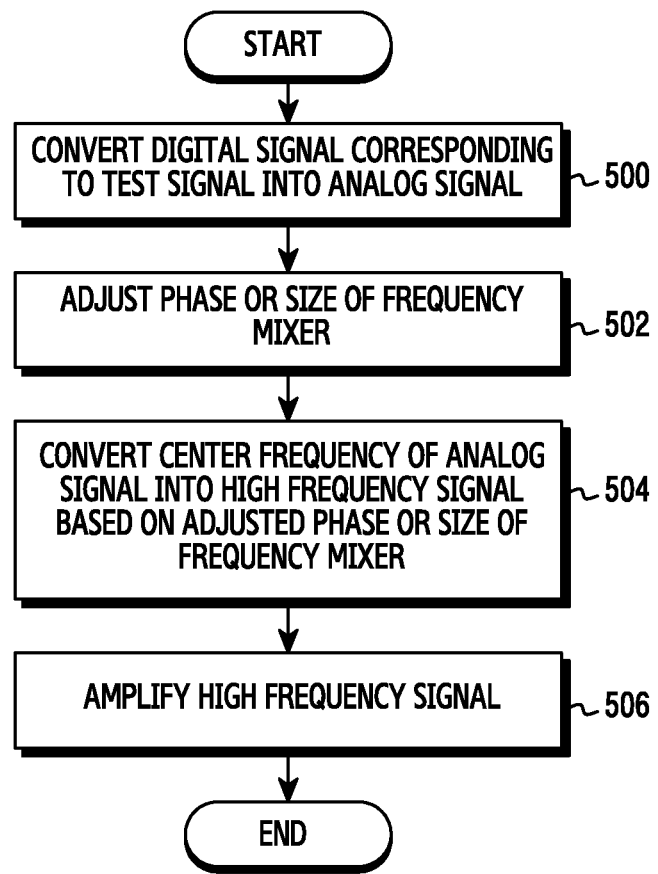
FIG. 5 is a flowchart of a method of processing a transmission signal according to an embodiment of the present disclosure.

FIG. 5 is a flowchart of a method of processing a transmission signal according to an embodiment of the present disclosure. In FIG. 5, it is assumed that a digital signal is not calibrated in the pre-distorter 114.

Referring to FIG. 5, the first DAC 121 converts a digital signal into an analog signal in step 500.

The second DAC 124 converts a calibration code provided from the calibration code generator 116 into an analog signal, outputs the analog signal to the first frequency mixer 122, and may change a DC offset, or a phase or an amplitude of a transmission signal input into the first frequency mixer 122, in step 502.

The first frequency mixer 122 is provided with the analog calibration value from the second DAC 124, calibrates the analog transmission signal, and may up-convert a center frequency of the analog transmission signal, so as to output an RF signal (e.g. high frequency signal), in step 504.

The PA 123 amplifies the RF signal (e.g. high frequency signal), in step 506.

Figure 6:
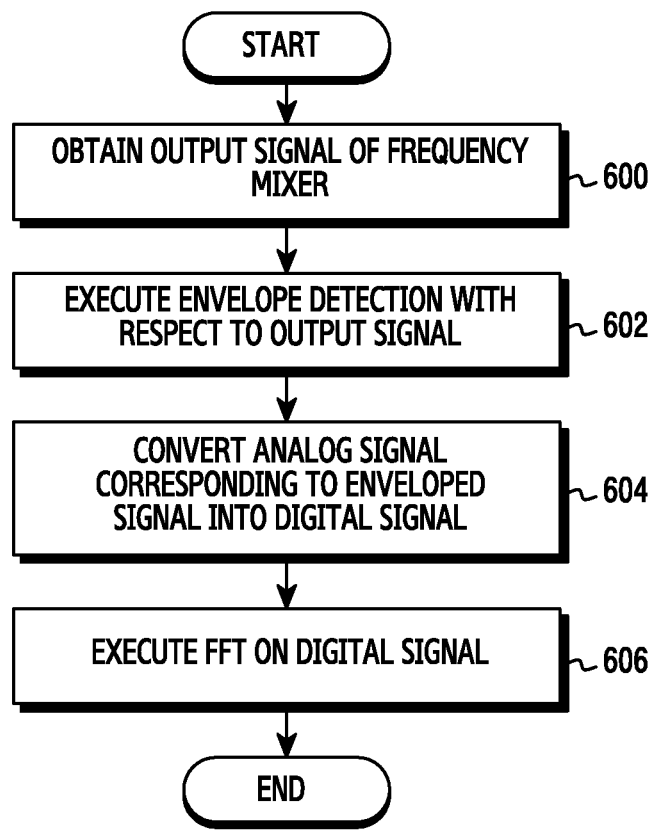
FIG. 6 is a flowchart of a method of outputting a spectrum of a transmission signal according to an embodiment of the present disclosure.

FIG. 6 is a flowchart of a method of outputting a spectrum of a transmission signal according to an embodiment of the present disclosure.

Referring to FIG. 6, the envelope detector 125 obtains an output signal from the frequency mixer 122 in step 600, and executes envelope detection in step 602. For example, an envelope signal is detected.

The ADC 128 converts the envelope signal into a digital signal in step 604.

The FFT calculator 118 executes an FFT calculation with respect to the digital signal so as to output a spectrum of the digital signal, in step 606.

Figure 7:
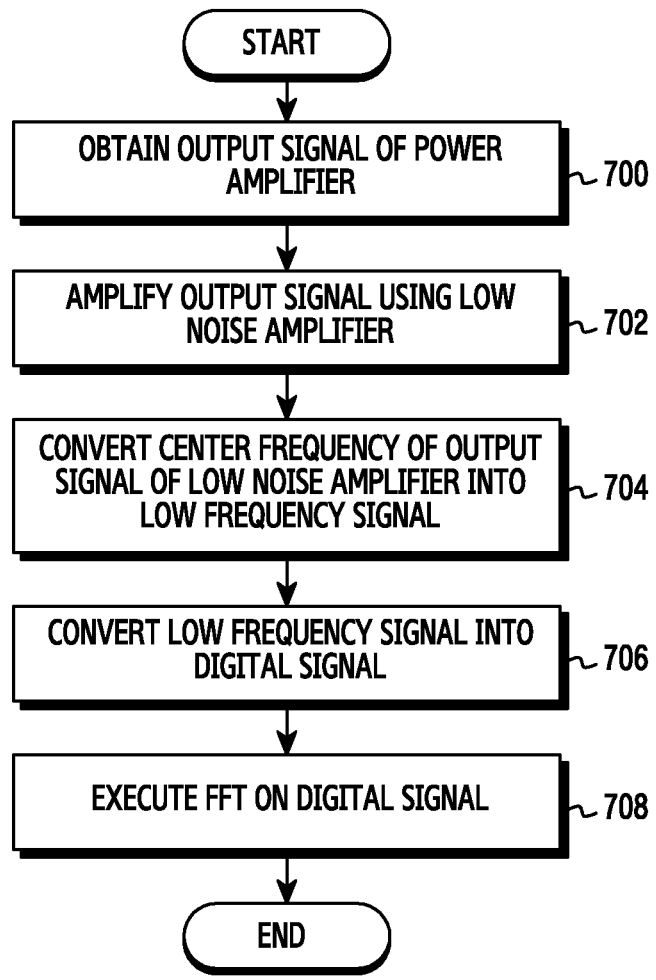
FIG. 7 is a flowchart of a method of outputting a spectrum of a transmission signal according to an embodiment of the present disclosure.

FIG. 7 is a flowchart of a method of outputting a spectrum of a transmission signal according to an embodiment of the present disclosure.

Referring to FIG. 7, the LNA 126 obtains an output signal from the PA 123, in step 700, and amplifies a transmission signal fed back from the PA 123 to a signal in a level appropriate for being processed in the second frequency mixer 127.

The second frequency mixer 127 down-converts the transmission signal that is fed back into an I/Q signal of a baseband (or an intermediate frequency), in step 704.

The ADC 128 converts an analog output signal of the second frequency mixer 127 into a digital signal, and outputs the same to the FFT calculator 118, in step 706.

The FFT calculator 118 executes an FFT calculation with respect to the digital signal so as to output a spectrum of the digital signal, in step 708.

FIG. 8 is a flowchart of a binary search algorithm for searching for a calibration code according to an embodiment of the present disclosure.

In FIG. 8, $N_{code}$ denotes a total number of bits of a calibration code, a $Code_{init}$ denotes an initial code value, $Code_{cur}$ denotes a current code value, $Code_{min}$ denotes a code for minimum signal distortion, $Code_{conf}$ denotes a confirmed code, $B_{cal}$ denotes a current calibration bit, $CL_{min}$ denotes a size of minimum signal distortion, $CL(Code_{cur})$ denotes a size of signal distortion corresponding to a current code, and $Code_{cur}[B_{cal}]$ denotes a current code value corresponding to the current calibration bit.

An initial code value is set and a size of signal distortion based on the initial code value is determined, in step 800.

A corresponding calibration bit is changed into another value, and a code value corresponding to a small signal distortion size is maintained as a current code, in step 810. For example, after a corresponding calibration bit is changed into a first value, when a size of signal distortion of the modified code is smaller than a size of signal distortion of a previous code (for example, a code before the change), the modified code with the first value is maintained. Conversely, when the size of signal distortion of the modified code is greater than the size of signal distortion of the previous code (for example, the code before the change), the previous code is maintained. Subsequently, a size of signal distortion corresponding to a code obtained after subtracting 1 from a higher code (for example, $Code_{conf}$) including the corresponding calibration bit in the previous code and a size of signal distortion corresponding to the previous code are compared and a code having a smaller signal distortion size is maintained as a current code.

For example, when a seventh bit (counting from right to left) of 10000000 is changed to a 1 to obtain 11000000 and a signal distortion size of 11000000 is smaller than a signal distortion size of 10000000, 11000000 is maintained, and the process proceeds with a following bit. Conversely, when the signal distortion size of 11000000 is greater than the signal distortion size of 10000000, the previous code, 10000000, is maintained, and a signal distortion size of a code corresponding to 10000000−01000000=01000000 (e.g. subtracting 1 from the seventh bit position) may be checked. Here, the value of the highest two bits 10 is a confirmed code, and the confirmed code may be changed to 10−01=01, by subtracting 1 from the seventh bit position. A signal distortion size of 10000000 and a signal distortion size of 01000000 are compared and a code having a smaller signal distortion size is maintained. When the signal distortion size of 01000000 is greater than the signal distortion size of 10000000, the previous code value (e.g. 10000000) may be maintained by adding 01000000 (e.g. adding 1 to the seventh bit position) to 01000000.

When a corresponding bit value is determined in step 810, the process proceeds with a following bit and step 810 is executed up to the last bit, in steps 810 and 820.

Subsequently, when step 810 is executed as many times as the number of code bits, an optimal code is determined in step 840.

When the optimal code is determined, calibration is terminated in step 850.

First, an I-code and a Q-code (or a size code and a phase code in the case of I/Q mismatch), is set to an initial code named $Code_{init}$. A code searching time may vary based on selection of the initial code, but any value may be selected. Then, a signal distortion size is measured from the state of the initial code. A method of measuring the signal distortion size may measure a size of a carrier leakage component (e.g. an $f_C$ band component illustrated in FIG. 10 and described below) using a spectrum in a PA output, or may execute an ADC conversion on a transmission signal fed back to an envelope detector, analyze a frequency using an FFT or the like, and measure a size of a carrier leakage component (e.g. $f_{test}$ illustrated in FIG. 10 and described below). In the same manner, when an image component (e.g. $f_C-f_{test}$) is measured from a PA output, a signal distortion size may be measured by measuring an $f_C-f_{test}$ component of FIG. 9. When an envelope detector is used, a signal distortion size may be measured by measuring the $2-f_{test}$ component of FIG. 9. The IP2 characteristics of a receiver may be obtained by measuring a DC value of an I path and a Q path at a wireless receiver output.

FIGS. 9A to 9D each illustrate a spectrum of a transmission signal according to an embodiment of the present disclosure.

Figure 9A:
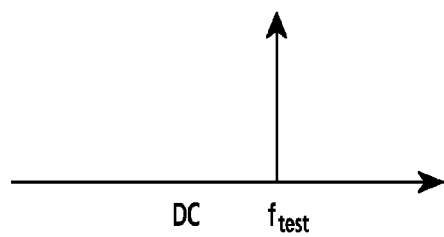
FIGS. 9A to 9D each illustrate a spectrum of a transmission signal according to an embodiment of the present disclosure.

FIG. 9A illustrates a spectrum of a test signal generated in the test signal generator 112. For example, when the test signal is a sine wave of $f_{test}$, a signal is shown at $f_{test}$ in the frequency domain.

Figure 9B:
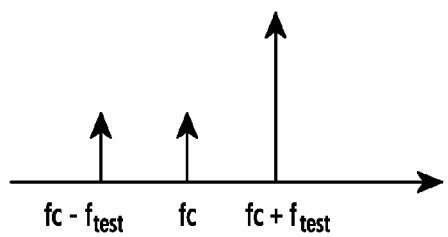

FIG. 9B illustrates a spectrum of a transmission output signal including a carrier leakage signal and an image signal. For example, when a sine wave of $f_{test}$ and carrier wave of $f_C$ are multiplexed in a frequency mixer, a signal may be shown at $f_C-f_{test}$, $f_C$, and $f_C+f_{test}$ in the frequency domain. Here, $f_C$ is a carrier leakage signal, and $f_C-f_{test}$ is an image signal. $f_C-f_{test}$ may occur due to I/Q mismatch.

Figure 9C:
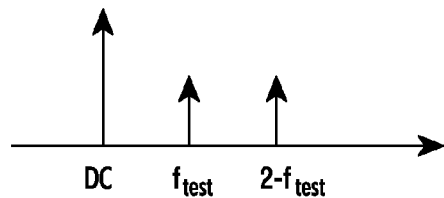

FIG. 9C illustrates a spectrum of an output signal of an envelope detector in a DC coupling mode. In the spectrum of the output signal of the envelope detector, a signal is shown at DC, $f_{test}$, and $2·f_{test}$.

Figure 9D:
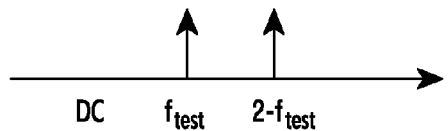

FIG. 9D illustrates a spectrum of an output signal of an envelope detector in an AC coupling mode. In the spectrum of the output signal of the envelope detector, a signal may be shown at $f_{test}$ and $2 \cdot f_{test}$.

Figure 10:
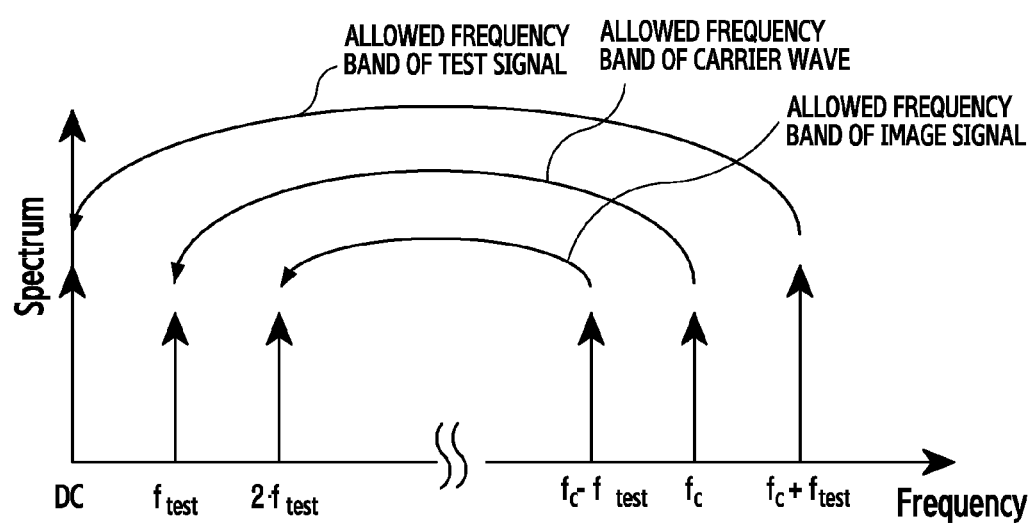
FIG. 10 illustrates conversion of a frequency of an output signal transmitted from an envelope detector according to an embodiment of the present disclosure.

FIG. 10 illustrates conversion of a frequency of an output signal transmitted from an envelope detector according to an embodiment of the present disclosure.

Referring to FIG. 10, when a transmission output signal passes through an envelope detector, moves to $2 \cdot f_{test}$, $f_C$ moves to $f_{test}$, $f_C + f_{test}$ moves to DC.

Figure 11:
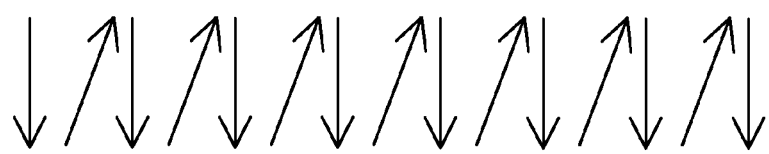
FIG. 11 illustrates a sequence of searching for an I/Q code by considering I/Q dependency according to an embodiment of the present disclosure.

FIG. 11 illustrates a sequence of searching for an I/Q code by considering I/Q dependency according to an embodiment of the present disclosure.

Referring to FIG. 11, when each I/Q code is 8 bits, considering I/Q dependency and using the binary search algorithm of FIG. 8, each I/Q code determines a value of a first bit of the I code and a first bit of the Q code, subsequently determines a value of a second bit of the I code and a second bit of the Q code, subsequently determines a value of a third bit of the I code and a third bit of the Q code, subsequently determines a value of a fourth bit of the I code and a fourth bit of the Q code, subsequently determines a value of a fifth bit of the I code and a fifth bit of the Q code, subsequently determines a value of a sixth bit of the I code and a sixth bit of the Q code, subsequently determines a value of a seventh bit of the I code and a seventh bit of the Q code, and lastly determines a value of an eighth bit of the I code and an eighth bit of the Q code.

As described above, considering I/Q dependency, by alternately increasing the I code and the Q code based on a bit unit, the 8-bit calibration code that may minimize distortion of a transmission signal may be detected.

FIGS. 12A and 12B each illustrate an example of a binary search algorithm for searching for a calibration code according to an embodiment of the present disclosure.

Referring to FIG. 12A, when an eighth bit (counting from right to left) of an initial calibration code value 00000000 is changed from 0 to 1, a calibration code value 10000000 is obtained. In this instance, a signal distortion size corresponding to the initial calibration code value 00000000 is greater than a signal distortion size corresponding to the calibration code value 10000000, and thus, the calibration code value 10000000 is maintained (①).

Subsequently, when a seventh bit of the calibration code 10000000 is changed from 0 to 1, a calibration code value 11000000 is obtained. In this instance, the signal distortion size corresponding to the calibration code value 10000000 is smaller than a signal distortion size corresponding to the calibration code value 11000000, and thus, the calibration code value 10000000 is maintained (②).

Subsequently, when a sixth bit of the calibration code value 10000000 is changed from 0 to 1, a calibration code value 10100000 is obtained. In this instance, the signal distortion size corresponding to the calibration code value 10000000 is smaller than a signal distortion size corresponding to the calibration code value 10100000, and thus, the calibration code value 10000000 is maintained (③).

Although a fifth bit, a fourth bit, a third bit, a second bit, and a first bit are sequentially changed, all signal distortion sizes corresponding to the changes are greater than the signal distortion size corresponding to the calibration code value 10000000, and thus, the calibration code value 10000000 is maintained. However, the calibration code value 10000000 may not converge to an optimal calibration code value, but may converge to the calibration code value 10000000 obtained when the first bit of the initial calibration code value 00000000 is changed.

As another example, a calibration code value is corrected to be compared within a wide range as shown in FIG. 12B. For example, FIG. 12A searches for a calibration code value in a range from 10000000 (e.g. decimal number 128) to 11000000 (e.g. decimal number 192), but FIG. 12B searches for a calibration code value in a range from 10000000 (e.g. decimal number 128) to 01000000 (e.g. decimal number 64).

For example, when a eighth bit (counting from right to left) of the initial calibration code value 00000000 is changed from 0 to 1, a calibration code value 10000000 is obtained. In this instance, a signal distortion size corresponding to the initial calibration code value 00000000 is greater than a signal distortion size corresponding to the calibration code value 10000000, and thus, the calibration code value 10000000 is maintained (①).

Subsequently, when a seventh bit of the calibration code value 10000000 is changed from 0 to 1, a calibration code value 11000000 is obtained. In this instance, a signal distortion size corresponding to the calibration code value 10000000 is smaller than a signal distortion size corresponding to the calibration code value 11000000, and thus, the calibration code value 10000000 is maintained (②).

Subsequently, when 01000000 is subtracted from the calibration code value 10000000 (e.g. subtracting the two highest bits including the seventh bit results in 10−01=01), 01000000 is obtained. In this instance, a signal distortion size corresponding to the calibration code value 10000000 is greater than a signal distortion size corresponding to a calibration code value 01000000, and thus, the calibration code value 01000000 is maintained (③).

Subsequently, when a sixth bit of the calibration code value 01000000 is changed from 0 to 1, a calibration code value 01100000 is obtained. In this instance, the signal distortion size corresponding to the calibration code value 01000000 is smaller than a signal distortion size corresponding to the calibration code value 01100000, and thus, the calibration code value 01000000 is maintained (④).

Subsequently, when 00100000 is subtracted from the calibration code value 01000000 (e.g. subtracting the three highest bits including the sixth bit results in 010−001=001), 00100000 is obtained. In this instance, the signal distortion size corresponding to the calibration code value 01000000 is smaller than a signal distortion size corresponding to a calibration code value 00100000, and thus, the calibration code value 01000000 is maintained. That is, the signal distortion sizes obtained by applying +1 and −1 to the sixth bit (e.g., adding 1 to and subtracting 1 from the sixth bit position) are greater than the current calibration code value 01000000, and thus, the current calibration code value 01000000 is maintained and the process proceeds with a following bit.

Subsequently, when a fifth bit of the calibration code value 01000000 is changed from 0 to 1, a calibration code value 01010000 is obtained. In this instance, the signal distortion size corresponding to the calibration code value 01000000 is smaller than a signal distortion size corresponding to the calibration code value 01010000, and thus, the calibration code value 01000000 is maintained.

Subsequently, when 00010000 is subtracted from the calibration code value 01000000 (e.g. the four highest bits including the fifth bit results in 0100−0001=0011), 00110000 is obtained. In this instance, the signal distortion size corresponding to the calibration code value 01000000 is smaller than a signal distortion size corresponding to a calibration code value 00110000, and thus, the calibration code value 01000000 is maintained. That is, the signal distortion sizes obtained by applying +1 and −1 to the fifth bit (e.g., adding 1 to and subtracting 1 from the fifth bit position) are greater than the current calibration code value 01000000, and thus, the current calibration code value 01000000 is maintained and the process proceeds with a following bit.

Subsequently, when a fourth bit of the calibration code value 01000000 is changed from 0 to 1, a calibration code value 01001000 is obtained. In this instance, the signal distortion size corresponding to the calibration code value 01000000 is greater than a signal distortion size corresponding to the calibration code value 01001000, and thus, the calibration code value 01001000 is maintained.

Subsequently, when a third bit of the calibration code value 01001000 is changed from 0 to 1, a calibration code value 01001100 is obtained. In this instance, a signal distortion size corresponding to the calibration code value 01001000 is smaller than a signal distortion size corresponding to the calibration code value 01011000, and thus, the calibration code value 01001000 is maintained.

Subsequently, when 00000100 is subtracted from the calibration code value 01001000 (e.g. the six highest bits including the third bit results in 010010−000001=01000100), 01000100 is obtained. In this instance, the signal distortion size corresponding to the calibration code value 01001000 is smaller than a signal distortion size corresponding to a calibration code value 01000100, and thus, the calibration code value 01001000 is maintained. That is, the signal distortion sizes obtained by applying +1 and −1 to the third bit (e.g. adding 1 to and subtracting 1 from the third bit position) are greater than the current calibration code value 01001000, and thus, the current calibration code value 01001000 is maintained and the process proceeds with a following bit.

Subsequently, when a second bit of the calibration code value 01001000 is changed from 0 to 1, a calibration code value 01001010 is obtained. In this instance, a signal distortion size corresponding to the calibration code value 01001000 is greater than a signal distortion size corresponding to the calibration code value 01001010, and thus, the calibration code value 01001010 is maintained.

Subsequently, when a first bit of the calibration code value 01001010 is changed from 0 to 1, a calibration code value 01001011 is obtained. In this instance, the signal distortion size corresponding to the calibration code value 01001010 is smaller than a signal distortion size corresponding to the calibration code value 01001011, and thus, the calibration code value 01001010 is maintained.

Subsequently, when 00010000 is subtracted from the calibration code value 01001010 (e.g. the eight highest bits including the first bit results in 01001010−00000001=01001001), 01001001 is obtained. In this instance, a signal distortion size corresponding to the calibration code value 01001010 is smaller than a signal distortion size corresponding to a calibration code value 01001001, and thus, the calibration code value 01001010 is maintained. That is, the signal distortion sizes obtained by applying +1 and −1 to the eighth bit (e.g. adding 1 to and subtracting 1 from the first bit position) are greater than the current calibration code value 01001010, and thus, the current calibration code value 01001010 is maintained.

As described above, the method increases a corresponding bit value, compares a signal distortion size of a code value before the change and a signal distortion size of a code value after the change, and maintains a code having a small signal distortion. When the signal distortion size corresponding to the code after the change is greater than the other, the method decreases the corresponding bit value, compares a signal distortion size of the code value before the decrease and a signal distortion size of a code value after the decrease, and maintains a code having a small signal distortion. When the signal distortion sizes obtained by increasing or decreasing the corresponding bit value are greater than the signal distortion sizes corresponding to the previous code, the previous code value is maintained and the process proceeds with a following bit.

Figure 13A:
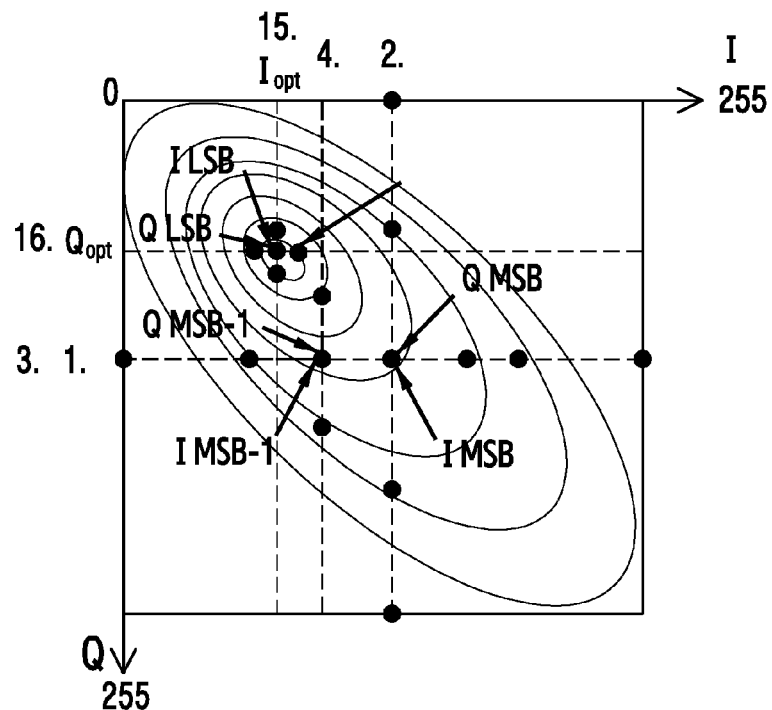
FIGS. 13A and 13B illustrate a code search location, based on a relationship between a binary search algorithm for searching for a calibration code and a distortion function, according to an embodiment of the present disclosure.
Figure 13B:
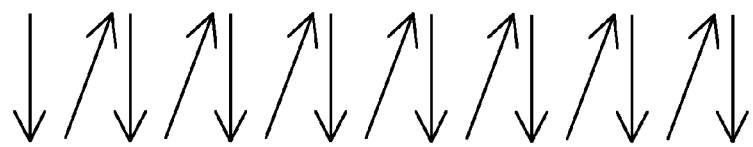

FIGS. 13A and 13B illustrate a code search location, based on a relationship between a binary search algorithm for searching for a calibration code and a distortion function, according to an embodiment of the present disclosure.

FIG. 13A illustrates a function of signal distortion expressed by an I code and a Q code, and the x-axis denotes an I code value and the y-axis denotes an Q code value. The signal distortion function may be a carrier leakage size based on an I code and a Q code, or may be an image component $(f_C-f_{test})$ size caused by I/Q mismatch.

FIG. 13B illustrates a sequence of a binary search algorithm executed with respect to a bit, by taking into consideration dependency between I/Q code.

In one case, the method may detect an optimal code through only 2*N searches by executing a search based on a bit unit of a binary code (that is, a distortion size of a transmission signal is detected by changing a bit value once with respect to all bit searches, and the distortion size of the transmission signal is smaller than a current distortion size, and thus, a temporary optimal code is detected a first time). For example, when a code length is 8 bits, an optimal code is obtained through 16 (=2*8) searches.

FIG. 13A corresponds to the case in which a distortion size of a transmission signal is detected by changing a bit value once with respect to all bit searches, and the distortion size of the transmission signal is smaller than a current distortion size, and thus, a temporary optimal code is detected a first time. An I/Q code value that minimizes distortion of the transmission signal may be determined through a total of 16 searches.

Conversely, in another case (that is, a temporary optimal code is detected by changing a bit value two times with respect to all bit searches, and searching for the distortion size of a transmission signal), an optimal code may be detected through 4*N searches. For example, when a code length is 8 bits, an optimal code is obtained through 32(=4*8) searches.

In addition, when an optimal code is regularly distributed in a search range, the optimal code may be detected through only about 3*N searches.

Therefore, a searching time may be shortened in comparison to the conventionally provided method. For example, the existing coarse-fine method has a search speed of $6 \times 2^N/2$ and thus, the searching time geometrically increases as a length N of bits increases. Conversely, in the case of a binary search algorithm, a searching time linearly increases, and thus, may reduce the time expended for searching for an optimal code.

In addition, due to I/Q dependency, that is, since an accuracy code is obtained after repeatedly searching for an I code and an Q code due to interference between I/Q codes, the search is alternately executed with respect to the I code and the Q code for each bit, and thus, a search speed and an accuracy may be maintained.

As described above, the binary search algorithm for calibration of carrier leakage, I/Q mismatch, and IP2 has been provided by taking into account the characteristics of a function of a control code and the I/Q dependency, and thus, the code searching time is efficiently reduced.

In addition, the search is executed bit by bit with respect to the I code and the Q code alternately. The search for the I code and the Q code are repeated as many times as the length N of a code used for calibration, and thus, I/Q code interference due to I/Q dependency may be minimized by maximizing the repetition.

In addition, improvement in code search speed and accuracy may reduce steps required for producing an RF transceiver or a calibration time required when a terminal operates, and thus, may improve a production cost per unit and a boot-up speed. The calibration of the RF transceiver is repeatedly required in various steps such as RFIC verification, terminal verification, or the like, and the improvement may have a great effect.

While the present disclosure has been shown and described with reference to certain embodiments thereof, it will be understood by those skilled in the art that various changes in form and details may be made therein without departing from the scope and spirit of the present disclosure. Therefore, the scope of the present disclosure should not be defined as being limited to the embodiments, but should be defined by the appended claims and equivalents thereof.

What is claimed is:

1. An electronic device for determining a calibration code, comprising:
a modem configured to receive a transmission signal, determine a calibration code that minimizes distortion of the transmission signal, and calibrate the distortion of the transmission signal using the calibration code, wherein the modem is further configured to determine the calibration code by:
generating a first calibration code, wherein the first calibration code includes a pre-determined number of bit positions:
determining distortion corresponding to the first calibration code;
generating a second calibration code by adding a 1 bit to a pre-determined bit position of the first calibration code;
determining distortion corresponding to the second calibration code;
setting the calibration code to the second calibration code if the distortion corresponding to the second calibration code is less than that of the first calibration code and setting the first calibration code to the second calibration code, otherwise generating a third calibration code by subtracting a 1 bit from the pre-determined bit position of the first calibration code, determining distortion corresponding to the third calibration code, and setting the calibration code to the third calibration code if the distortion corresponding to the third calibration code is less than that of the first calibration code and setting the first calibration code to the third calibration code, otherwise setting the calibration code to the first calibration; and
repeating the above identified steps, starting with the step for generating the second calibration code for a next pre-determined bit position in the calibration code, until all bit positions in the calibration code have been processed.

2. The device of claim 1, wherein the modem further comprises:
an I/Q modulator;
a test signal generator;
a Fast Fourier Transform (FFT) calculator configured to receive a signal from an Analog-to-Digital Converter (ADC);
a calibration code generator configured to receive a signal from the FFT;
a pre-distorter unit configured to receive a signal from the test signal generator, the I/Q modulator, and a signal from the calibration code generator; and
an I/Q demodulator.

3. The device of claim 2, wherein the test generator is configured to generate a sinusoidal wave having a phase difference of 90 degrees.

4. The device of claim 2, wherein the FFT is further configured to measure a size of distortion of a signal based on a spectrum of the signal.

5. The device of claim 2, wherein the pre-distorter unit is further configured to change a Direct Current (DC) offset or an amplitude and phase of an I/Q signal.

6. The device of claim 1, further comprising:
a first Digital-to-Analog Converter (DAC) configured to receive a signal from a pre-distorter unit;
a second Digital-to-Analog Converter (DAC) configured to receive a signal from a calibration code generator;
a first frequency mixer configured to receive signals from the first DAC and the second DAC;
an envelop detector configured to receive a signal from the first frequency mixer; and
an Analog-to-Digital Converter (ADC) configured to receive a signal from the envelop detector or a second frequency mixer.

7. The device of claim 6, wherein the envelop detector is further configured to detect an envelop signal of the first frequency mixer.

8. The device of claim 6, further comprising:
a power amplifier configured to receive a signal from the frequency mixer;
a low-noise amplifier configured to receive a signal from the power amplifier;
and the second frequency mixer configured to receive a signal from the low-noise amplifier.

9. A method of determining a calibration code by an electronic device, comprising:
receiving, by a modem, a transmission signal;
determining a calibration code that minimizes distortion of the transmission signal; and
calibrating the distortion of the transmission signal using the calibration code,
wherein determining the calibration code comprises:
generating a first calibration code, wherein the first calibration code includes a pre-determined number of bit positions;
determining distortion corresponding to the first calibration code;
generating a second calibration code by adding a 1 bit to a pre-determined bit position of the first calibration code;
determining distortion corresponding to the second calibration code;
setting the calibration code to the second calibration code if the distortion corresponding to the second calibration code is less than that of the first calibration code and setting the first calibration code to the second calibration code, otherwise generating a third calibration code by subtracting a 1 bit from the pre-determined bit position of the first calibration code, determining distortion corresponding to the third calibration code, and setting the calibration code to the third calibration code if the distortion corresponding to the third calibration code is less than that of the first calibration code and setting the first calibration code to the third calibration code, otherwise setting the calibration code to the first calibration; and repeating the above identified steps, starting with the step for generating the second calibration code for a next pre-determined bit position in the calibration code, until all bit positions in the calibration code have been processed.

10. The method of claim 9 further comprises:

receiving an I/Q signal from an I/Q modulator;

receiving a test signal from a test signal generator;

calculating a Fast Fourier Transform (FFT) of a signal received from an Analog-to-Digital Converter (ADC);

generating a calibration code from the FFT;

receiving a signal from the test signal generator, the I/Q modulator, and a calibration code generator; and demodulating an I/Q signal.

11. The method of claim 10, wherein the test signal is a sinusoidal wave having a phase difference of 90 degrees.

12. The method of claim 10, wherein the FFT measures a size of distortion of a signal based on a spectrum of the signal.

13. The method of claim 10, further comprising changing a Direct Current (DC) offset or an amplitude and phase of an I/Q signal.

14. The method of claim 9, further comprising:

receiving, from a first Digital-to-Analog Converter (DAC), a signal from a pre-distorter unit;

receiving, from a second Digital-to-Analog Converter (DAC), a signal from a calibration code generator;

receiving, from a first frequency mixer, signals from the first DAC and the second DAC;

receiving, from an envelop detector, a signal from the first frequency mixer; and receiving, from an Analog-to-Digital Converter (ADC), a signal from the envelop detector or a second frequency mixer.

15. The method of claim 14, further comprising detecting, by the envelop detector, an envelop signal of the first frequency mixer.

16. The method of claim 14, further comprising:

receiving, from a power amplifier, a signal from the frequency mixer;

receiving, from a low-noise amplifier, a signal from the power amplifier; and receiving, from and the second frequency mixer, a signal from the low-noise amplifier.

* * * * *